United States Patent
Annampedu

(10) Patent No.: US 8,054,931 B2
(45) Date of Patent: Nov. 8, 2011

(54) SYSTEMS AND METHODS FOR IMPROVED TIMING RECOVERY

(75) Inventor: Viswanath Annampedu, Schnecksville, PA (US)

(73) Assignee: Agere Systems Inc., Allentown, PA (US)

( * ) Notice: Subject to any disclaimer, the term of this patent is extended or adjusted under 35 U.S.C. 154(b) by 804 days.

(21) Appl. No.: 11/841,033

(22) Filed: Aug. 20, 2007

(65) Prior Publication Data

US 2009/0052602 A1     Feb. 26, 2009

(51) Int. Cl.
*H03D 3/24* (2006.01)

(52) U.S. Cl. ........ 375/376; 375/316; 375/324; 375/340; 375/341; 375/346; 375/354; 375/373; 375/374; 375/375

(58) Field of Classification Search .......... 375/316, 375/317, 324, 327, 340–341, 346, 354, 373–376; 327/2–3, 147, 156, 159
See application file for complete search history.

(56) References Cited

U.S. PATENT DOCUMENTS

| | | |
|---|---|---|
| 3,973,182 A | 8/1976 | Kataoka |
| 3,973,183 A | 8/1976 | Kataoka |
| 4,024,571 A | 5/1977 | Dischert et al. |
| 4,777,544 A | 10/1988 | Brown et al. |
| 5,130,866 A | 7/1992 | Klaassen et al. |
| 5,237,325 A | 8/1993 | Klein et al. |
| 5,278,703 A | 1/1994 | Rub et al. |
| 5,309,357 A | 5/1994 | Stark et al. |
| 5,341,249 A | 8/1994 | Abbott et al. |
| 5,377,058 A | 12/1994 | Good et al. |
| 5,521,948 A | 5/1996 | Takeuchi |
| 5,523,902 A | 6/1996 | Pederson |
| 5,668,679 A | 9/1997 | Swearingen et al. |
| 5,696,639 A | 12/1997 | Spurbeck et al. |
| 5,781,129 A | 7/1998 | Schwartz et al. |
| 5,798,885 A | 8/1998 | Saiki et al. |
| 5,835,295 A | 11/1998 | Behrens |
| 5,844,920 A | 12/1998 | Zook et al. |
| 5,852,524 A | 12/1998 | Glover et al. |
| 5,986,830 A | 11/1999 | Hein |
| 5,987,562 A | 11/1999 | Glover |
| 6,009,549 A | 12/1999 | Bliss et al. |
| 6,023,383 A | 2/2000 | Glover et al. |
| 6,069,583 A | 5/2000 | Silvestrin et al. |
| 6,081,397 A | 6/2000 | Belser |
| 6,111,712 A | 8/2000 | Vishakhadatta et al. |

(Continued)

OTHER PUBLICATIONS

Annampedu, V. and Aziz, P.M., "Adaptive Algorithms for Asynchronous Detection of Coded Servo Signals Based on Interpolation", IEEE Trans. on Mag., vol. 41, No. 10, Oct. 2005.

(Continued)

*Primary Examiner* — Eva Puente
*Assistant Examiner* — Sophia Vlahos
(74) *Attorney, Agent, or Firm* — Hamilton DeSanctis & Cha

(57) ABSTRACT

Various embodiments of the present invention provide systems and methods for improved timing recovery. As one example, some embodiments of the present invention provide timing recovery circuits that include an error signal and a digital phase lock loop circuit. The error signal indicates a difference between the predicted sample time and an ideal sample time. The digital phase lock loop is operable to apply an adjustment value such that a subsequent sample time is moved toward the ideal sample time. Further, the digital phase lock loop circuit includes an adjustment limit circuit that is operable to limit the adjustment value.

20 Claims, 5 Drawing Sheets

U.S. PATENT DOCUMENTS

| | | | |
|---|---|---|---|
| 6,208,478 B1 | 3/2001 | Chiu et al. | |
| 6,278,591 B1 | 8/2001 | Chang | |
| 6,400,518 B1 | 6/2002 | Bhaumik et al. | |
| 6,404,829 B1 | 6/2002 | Sonu | |
| 6,441,661 B1 | 8/2002 | Aoki et al. | |
| 6,490,110 B2 | 12/2002 | Reed et al. | |
| 6,493,162 B1 | 12/2002 | Fredrickson | |
| 6,519,102 B1 | 2/2003 | Smith | |
| 6,530,060 B1 | 3/2003 | Vis et al. | |
| 6,603,622 B1 | 8/2003 | Christiansen et al. | |
| 6,606,048 B1 | 8/2003 | Sutardja | |
| 6,633,447 B2 | 10/2003 | Franck et al. | |
| 6,646,822 B1 | 11/2003 | Tuttle et al. | |
| 6,657,802 B1 | 12/2003 | Ashley et al. | |
| 6,775,529 B1 | 8/2004 | Roo | |
| 6,784,706 B2 * | 8/2004 | Van Der Valk et al. | 327/147 |
| 6,788,484 B2 | 9/2004 | Honma | |
| 6,813,108 B2 | 11/2004 | Annampedu et al. | |
| 6,816,328 B2 | 11/2004 | Rae | |
| 6,839,014 B2 | 1/2005 | Uda | |
| 6,856,183 B2 * | 2/2005 | Annampedu | 327/159 |
| 6,876,511 B2 | 4/2005 | Koyanagi | |
| 6,912,099 B2 | 6/2005 | Annampedu et al. | |
| 6,956,873 B2 * | 10/2005 | Lazarus et al. | 370/518 |
| 6,959,064 B2 * | 10/2005 | Spijker et al. | 375/376 |
| 6,963,521 B2 | 11/2005 | Hayashi | |
| 6,999,257 B2 | 2/2006 | Takeo | |
| 6,999,264 B2 | 2/2006 | Ehrlich | |
| 7,002,761 B1 | 2/2006 | Sutardja et al. | |
| 7,002,767 B2 | 2/2006 | Annampedu et al. | |
| 7,038,875 B2 | 5/2006 | Lou et al. | |
| 7,072,137 B2 | 7/2006 | Chiba | |
| 7,082,005 B2 | 7/2006 | Annampedu et al. | |
| 7,092,462 B2 | 8/2006 | Annampedu et al. | |
| 7,116,504 B1 | 10/2006 | Oberg | |
| 7,126,776 B1 | 10/2006 | Warren, Jr. et al. | |
| 7,136,250 B1 | 11/2006 | Wu et al. | |
| 7,154,689 B1 | 12/2006 | Shepherd et al. | |
| 7,167,328 B2 | 1/2007 | Annampedu et al. | |
| 7,180,693 B2 | 2/2007 | Annampedu et al. | |
| 7,187,739 B2 | 3/2007 | Ma | |
| 7,191,382 B2 | 3/2007 | James et al. | |
| 7,193,544 B1 | 3/2007 | Fitelson et al. | |
| 7,193,798 B2 | 3/2007 | Byrd et al. | |
| 7,199,961 B1 | 4/2007 | Wu et al. | |
| 7,203,013 B1 | 4/2007 | Han et al. | |
| 7,206,146 B2 | 4/2007 | Flynn et al. | |
| 7,230,789 B1 | 6/2007 | Brunnett et al. | |
| 7,253,984 B1 | 8/2007 | Patapoutian et al. | |
| 7,301,717 B1 | 11/2007 | Lee et al. | |
| 7,308,057 B1 | 12/2007 | Patapoutian | |
| 7,362,536 B1 | 4/2008 | Liu et al. | |
| 7,369,002 B2 * | 5/2008 | Spijker et al. | 331/17 |
| 7,375,918 B1 | 5/2008 | Shepherd et al. | |
| 7,411,531 B2 | 8/2008 | Aziz et al. | |
| 7,420,498 B2 | 9/2008 | Barrenscheen | |
| 7,423,827 B2 | 9/2008 | Neville et al. | |
| 7,446,690 B2 | 11/2008 | Kao | |
| 7,499,238 B2 | 3/2009 | Annampedu | |
| 7,620,101 B1 | 11/2009 | Jenkins | |
| 7,738,617 B1 * | 6/2010 | Fortin et al. | 375/373 |
| 7,750,975 B2 * | 7/2010 | Berg et al. | 348/484 |
| 2002/0001151 A1 | 1/2002 | Lake | |
| 2002/0044620 A1 * | 4/2002 | Spijker et al. | 375/371 |
| 2002/0150179 A1 | 10/2002 | Leis et al. | |
| 2002/0176185 A1 | 11/2002 | Fayeulle et al. | |
| 2002/0181377 A1 | 12/2002 | Nagata et al. | |
| 2003/0095350 A1 | 5/2003 | Annampedu et al. | |
| 2005/0001661 A1 * | 1/2005 | Regev | 327/156 |
| 2005/0046982 A1 | 3/2005 | Liu et al. | |
| 2005/0157415 A1 | 7/2005 | Chiang | |
| 2005/0243455 A1 | 11/2005 | Annampedu | |
| 2007/0071152 A1 | 3/2007 | Chen et al. | |
| 2007/0092040 A1 * | 4/2007 | Higashino | 375/327 |
| 2007/0104300 A1 | 5/2007 | Esumi et al. | |
| 2007/0183073 A1 | 8/2007 | Sutardja et al. | |
| 2007/0230015 A1 | 10/2007 | Yamashita | |
| 2007/0247735 A1 | 10/2007 | Neville | |
| 2007/0253084 A1 | 11/2007 | Annampedu | |
| 2007/0263311 A1 | 11/2007 | Smith | |
| 2008/0074778 A1 | 3/2008 | Annampedu | |
| 2008/0080082 A1 | 4/2008 | Erden et al. | |
| 2008/0212715 A1 | 9/2008 | Chang | |
| 2008/0266693 A1 | 10/2008 | Bliss et al. | |
| 2009/0002862 A1 | 1/2009 | Park | |
| 2009/0052075 A1 | 2/2009 | Annampedu | |
| 2009/0142620 A1 | 6/2009 | Yamamoto et al. | |

OTHER PUBLICATIONS

Aziz & Annampedu, "Interpolation Based Maximum-Likelihood(ML) Detection of Asynchronous Servo Repeatable Run Out (RRO) Data", IEEE Int. Mag. Con., vol. 42, No. 10, Oct. 2006.

* cited by examiner

SYSTEMS AND METHODS FOR IMPROVED TIMING RECOVERY

BACKGROUND OF THE INVENTION

The present invention is related to systems and methods for data synchronization, and more particularly to systems and methods for timing recovery in relation to a data set.

Many baseband and carrier-modulated communication systems utilize timing recovery circuits to synchronize to an available data stream. Such timing recovery circuits operate to recover a clock signal at the symbol rate that is both phase-locked and frequency-locked to the available data stream. As one particular example, a typical read channel employed in a hard disk drive may use a digital phase lock loop circuit as a timing recovery circuit to synchronize to a data stream retrieved from a magnetic storage medium associated with the hard disk drive. Such read channel devices serve as interfaces between a magnetic storage medium on which digital information is stored and external devices (e.g., Central Processing Unit (CPU)) that receive and process the digital information in various applications. Read channel devices take the analog information stored as magnetic pulses on the hard disk drive and convert that information into digital values (i.e., "1"s and "0"s) that are readable by digital devices, such as a CPU.

An example of a digital phase lock loop circuit 100 that may be used to perform timing recovery in read channel is depicted in FIG. 1. Turning to FIG. 1, digital phase lock loop circuit 100 includes a multiplier 105 which receives an error signal (E_N) and a slope (SLOPE) signal from a Viterbi detector. Multiplier 105 produces a phase error signal (PE) at its output. The phase error signal is provided as an input to both a multiplier 110 and a multiplier 115. Multiplier 110 has a frequency gain input (FREQ GAIN) signal, and multiplier 115 has a phase gain (PHASE GAIN) signal input. The output of multiplier 110 is provided to a summation circuit 120, and the output of multiplier 115 is provided to an adder 125. Summation circuit 120 aggregates the output of multiplier 110 and an output from a frequency register 130, and provides the aggregate back to frequency register 130. The output of frequency register 130 and the output of multiplier 115 are added together. The output of adder 125 is provided to a summation circuit 135. Summation circuit 135 aggregates the output of adder 125 and an output from a phase register 140, and provides the aggregate back to phase register 140. The output of phase register 140 is provided to a phase mixer 145 that provides an output signal to control a voltage controlled oscillator.

It is important that read channel devices have the ability to perform timing recovery at reasonably low signal-to-noise ratios. Where, however, the signal-to-noise ratio decreases too far, the read channel will experience an inability to recover a clock and/or an inability to maintain a lock condition. This inability renders the read channel unable to track an incoming waveform and provide accurate estimates of the sampling clock. In some existing read channels, the ability of the timing recovery circuit is stretched to its limits with the current signal-to-noise ratios. Further, the signal-to-noise ratio in many implementations continues to decrease due to, for example, proposed changes in data density and power considerations.

Hence, for at least the aforementioned reasons, there exists a need in the art for advanced systems and methods for timing recovery.

BRIEF SUMMARY OF THE INVENTION

The present invention is related to systems and methods for data synchronization, and more particularly to systems and methods for timing recovery in relation to a data set.

Various embodiments of the present invention provide systems and methods for improved timing recovery. As one example, some embodiments of the present invention provide timing recovery circuits that include an error signal and a digital phase lock loop circuit. The error signal indicates a difference between the predicted sample time and an ideal sample time. The digital phase lock loop is operable to apply an adjustment value such that a subsequent sample time is moved toward the ideal sample time. Further, the digital phase lock loop circuit includes an adjustment limit circuit that is operable to limit the adjustment value.

In some instances of the aforementioned embodiments the timing recovery circuits further include a detector and an error calculation circuit. The detector is operable to receive a data set that represents an original data set corrupted by noise. The detector is also operable to provide an estimation of the original data set based at least in part on the received data set. The error calculation circuit provides the error signal. A component of the error signal includes a difference between the received data set and the estimation of the original data set. In various instances of the aforementioned embodiments, the error calculation circuit includes a slope and error calculation circuit and a multiplier circuit. The slope and error calculation circuit provides a slope output and the difference between the received data set and the estimation of the original data set. The multiplier circuit combines the slope output and the difference between the received data set and the estimation of the original data set to create the error signal. In some cases, the detector may be an LDPC detector or a Viterbi detector.

In particular instances of the aforementioned embodiments, the adjustment value is a frequency adjustment value, and the digital phase lock loop further includes: a frequency gain circuit, a phase gain circuit, a frequency summation circuit, and a combination summation circuit. The frequency gain circuit modifies the error signal by a frequency gain to provide a frequency gain output, and the phase gain circuit modifies the error signal by a phase gain to provide a phase gain output. The frequency summation circuit maintains the frequency adjustment value, and includes: a frequency offset register and a first adder circuit. The first adder circuit is operable to add a value maintained in the frequency offset register to the frequency gain output, and to write the product of the addition to the frequency offset register subject to a limit imposed by the adjustment limit circuit. The combination summation circuit maintains a combined adjustment value, and includes: a combination offset register and a second adder circuit. The second adder circuit is operable to add a value maintained in the combination offset register to the phase gain output and to the value maintained in the frequency offset register, and to write the product of the addition to the combination offset register. In some such instances, the adjustment limit circuit limits the magnitude of the value maintained in the frequency offset register.

In other instances of the aforementioned embodiments, the adjustment value is a phase adjustment value, and the digital phase lock loop further includes: a frequency gain circuit, a phase gain circuit, a frequency summation circuit, and a combination summation circuit. The frequency gain circuit modifies the error signal by a frequency gain to provide a frequency gain output, and the phase gain circuit modifies the error signal by a phase gain to provide a phase gain output. The phase summation circuit maintains the phase adjustment value, and includes: a phase offset register and a first adder circuit. The first adder circuit is operable to add a value maintained in the phase offset register to the phase gain output, and to write the product of the addition to the frequency offset register subject to a limit imposed by the adjustment limit circuit. The combination summation circuit maintains a combined adjustment value, and includes: a combination offset register and a second adder circuit. The second adder circuit is operable to add a value maintained in the combination offset register to the frequency gain output and to the value maintained in the phase offset register, and to write the product of the addition to the combination offset register. In some such instances, the adjustment limit circuit limits the rate of change of the value maintained in the phase offset register.

In yet other instances of the aforementioned embodiments, the adjustment value is a frequency adjustment value, and the digital phase lock loop further includes: a frequency gain circuit and a frequency summation circuit. The frequency gain circuit modifies the error signal by a frequency gain to provide a frequency gain output. The frequency summation circuit maintains the frequency adjustment value, and includes: a frequency offset register, and an adder circuit. The adder circuit is operable to add a value maintained in the frequency offset register to the frequency gain output, and to write the product of the addition to the frequency offset register subject to a limit imposed by the adjustment limit circuit. In yet further instances of the aforementioned embodiments, the adjustment value is a phase adjustment value, and the digital phase lock loop further includes: a phase gain circuit and a phase summation circuit. The phase gain circuit modifies the error signal by a phase gain to provide a phase gain output. The phase summation circuit maintains the phase adjustment value, and includes: a phase offset register and an adder circuit. The adder circuit is operable to add a value maintained in the phase offset register to the phase gain output, and to write the product of the addition to the phase offset register subject to a limit imposed by the adjustment limit circuit.

In various instances of the aforementioned embodiments, the adjustment limit circuit is operable to receive an upper limit and a lower limit. In other instances, the adjustment limit circuit is operable to receive a baseline value, and to establish an upper limit and a lower limit based at least in part on the baseline value.

Other embodiments of the present invention provide methods for recovering timing information. Such methods include receiving an input signal, and sampling the input signal at a predicted sample time. An error signal is generated based at least in part on the sampled input signal, and the error signal corresponds to a difference between the predicted sample time and an ideal sample time. An adjustment value is created based at least in part on the error signal. The adjustment value is operable move a subsequent sample time toward the ideal sample time. The adjustment value is limited and the limited adjustment value is applied such that the predicted sample time is modified.

In some instances of the aforementioned embodiments, the methods further include providing digital phase lock loop that includes an adjustment limit circuit. In such instances, limiting the adjustment value is performed by the adjustment limit circuit. In other instances of the aforementioned embodiments, the methods further include establishing an adjustment limit that is utilized in limiting the adjustment value. Establishing the adjustment limit may include, but is not limited to, receiving an upper limit value and a lower limit value, or receiving a baseline value and determining an upper limit value and a lower limit value based at least in part on the baseline value. In one or more instances of the aforementioned embodiments, the limited adjustment value is a frequency adjustment value. In such instances, the methods may further include creating a phase adjustment value based at least in part on the error signal; and combining the frequency adjustment value and the phase adjustment value to create a combined adjustment value. In other instances of the aforementioned embodiments, applying the limited adjustment value includes applying the combined adjustment value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for data synchronization, and more particularly to systems and methods for timing recovery in relation to a data set.

Figure 1:
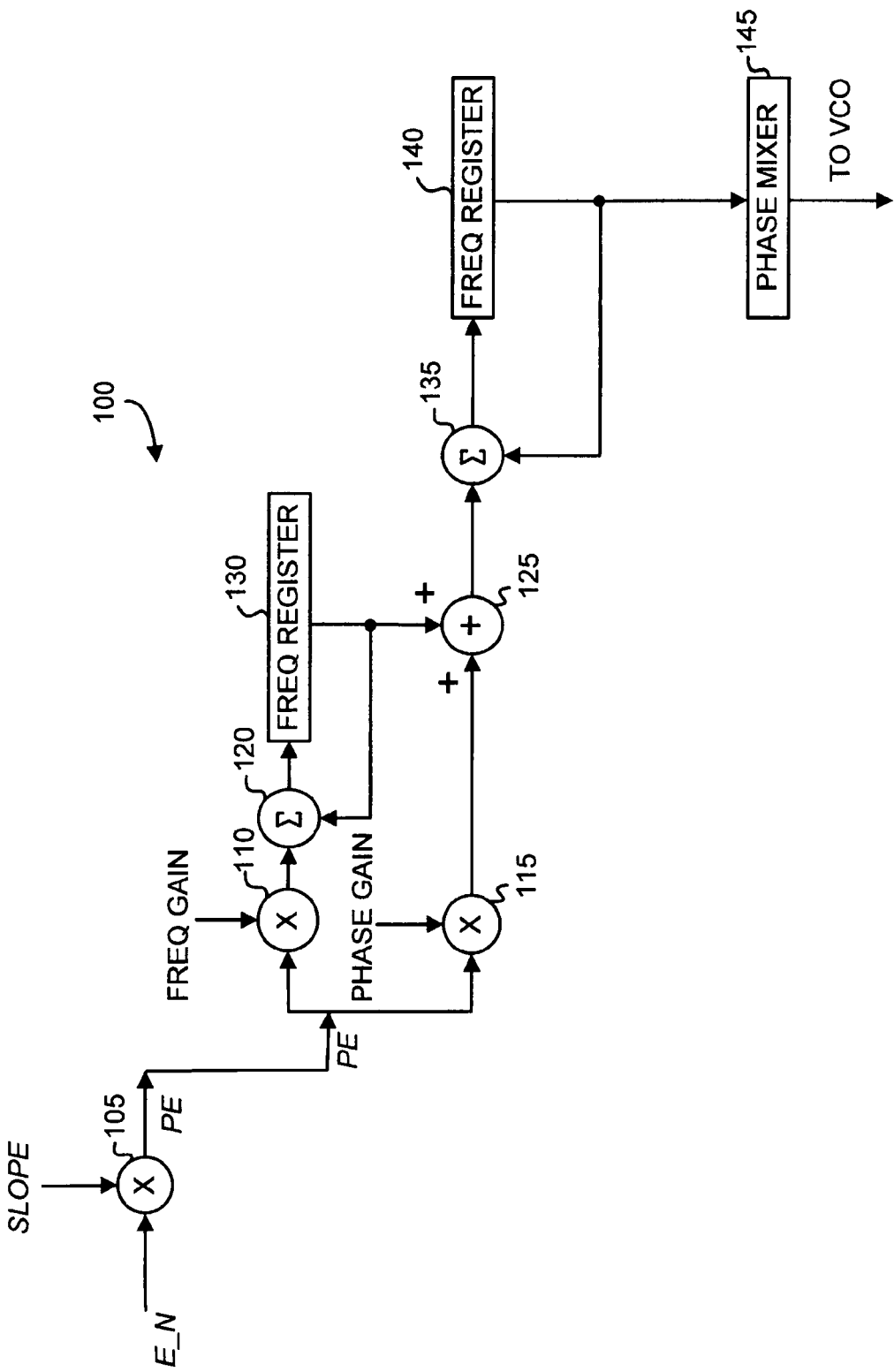
FIG. 1 is a prior art phase lock loop circuit.
Figure 2:
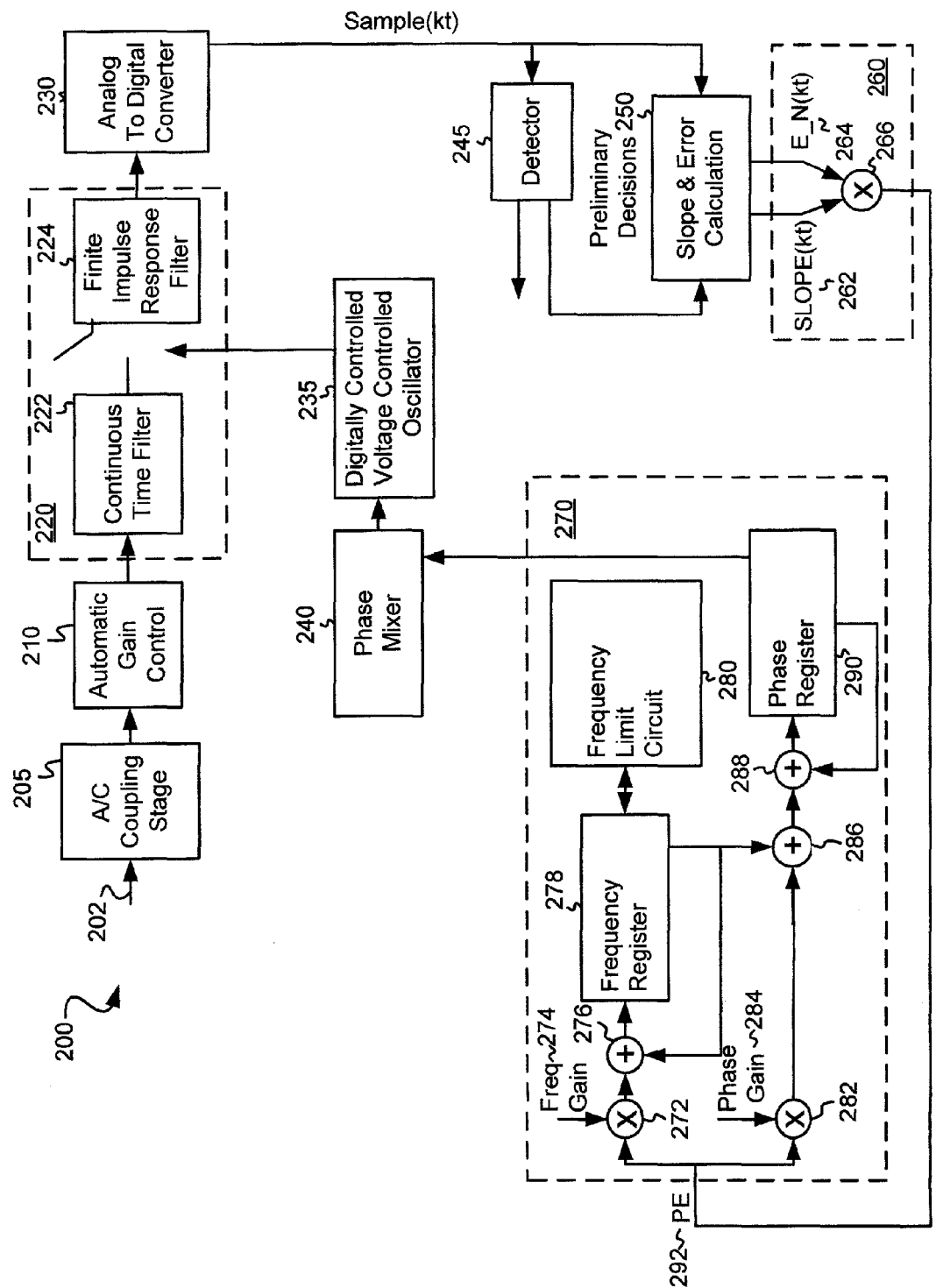
FIG. 2 is a timing recovery circuit including a frequency adjustment limiter in accordance with various embodiments of the present invention.

Turning to FIG. 2, a timing recovery circuit 200 in accordance with one or more embodiments of the present invention is depicted. Timing recovery circuit 200 includes an A/C coupling stage 205 and an automatic gain control circuit 210. A/C coupling stage 205 is tailored for receiving an input signal 202, and converting that signal to an analog electrical signal. In one particular embodiment of the present invention, timing recovery circuit 200 is implemented as part of a hard disk drive including a magnetic storage medium. In such an embodiment, A/C coupling stage 205 may be tailored for detecting a magnetic field from the magnetic storage medium, and for converting the magnetic field to an analog electrical signal. It should be noted that, depending upon the application, A/C coupling stage 205 may be tailored for converting an RF signal or other signal type to an analog electrical signal. As another particular example, where timing recovery circuit 200 is implemented in a cellular telephone or other radio frequency communication device, A/C coupling stage 205 may be used to receive a radio frequency signal, and to convert that radio frequency signal to an analog electrical signal. The analog electrical signal is provided to automatic gain control circuit 210 that operates to perform gain control on the analog electrical signal.

The gain controlled analog electrical signal is provided to an analog filter circuit 220. As shown, analog filter circuit 220 includes a continuous time filter 222 followed by a finite impulse response filter 224. In a synchronous system, the sampling of the output signal from continuous time filter 222 uses timing information from a digitally controlled voltage controlled oscillator 235. It should be noted that other types of analog filters may be used in relation to different embodiments of the present invention. Based on the disclosure provided herein, one of ordinary skill in the art will recognize an appropriate analog filtering scheme that may be used in relation with different embodiments of the present invention.

The output from analog filter 220 is provided to an analog to digital converter 230. Analog to digital converter 230 converts the filtered analog signal from filter 220 to the digital signal domain to produce a sequence of digital samples (Sample(kT)). Sample(kT) is an original data set corrupted by noise. Analog to digital converter 230 may be any circuit, device or system known in the art that is capable of converting an electrical signal from the analog domain to the digital domain. Based on the disclosure provided herein, one of ordinary skill in the art will recognize a variety of analog to digital converters that may be used in relation to different embodiments of the present invention.

Sample(kT) is provided to a detector circuit 245 and to a slope and error calculation circuit 250. In one particular embodiment of the present invention, detector circuit 245 is a maximum likelihood Viterbi detector that is capable of making preliminary decisions (i.e., an estimation of the original data set) about the received data stream. In other embodiments of the present invention, detector 245 is an LDPC detector. Based on the disclosure provided herein, one of ordinary skill in the art will recognize various detector types and/or algorithms that may be used in relation to different embodiments of the present invention. A data output 247 is provided from detector circuit 245 to a data receiving circuit (not shown).

The preliminary decisions are provided to slope and error calculation circuit 250. Slope and error calculation circuit 250 may be any circuit capable of determining both a slope output 262 (Slope(kT)) and a error output 264 (E_N(kT)). As one example, slope and error calculation circuit 250 may be similar to that disclosed in U.S. Pat. No. 6,856,183 entitled "Scheme to Improve Performance of Timing Recovery Systems for Read Channels in a Disk Drive" and filed by Annampedu on Oct. 12, 2001. The entirety of the aforementioned patent is incorporated herein by reference for all purposes. As discussed therein, slope and error calculation circuit 250 may include a slope look-up table (not shown) that is used to generate slope output 262. Further, as discussed therein, slope and error calculation circuit 250 compares the preliminary decisions from detector 245 and the raw output (Sample(kT)) from analog to digital converter 230. The comparison is used to generate error output 264. Based upon the disclosure provided herein, one of ordinary skill in the art will recognize other implementations of slope and error calculation circuit 250 that may be used in relation to different embodiments of the present invention.

Slope output 262 and error output 264 are provided to a phase detector circuit 260 that provides a phase error signal 292. In the depicted embodiment, phase detector circuit 260 includes a multiplier circuit 266 that combines slope output 262 and error output 264. The product from multiplier circuit 266 is a phase error signal 292 (PE) that is provided to a digital phase lock loop circuit 270. In particular, phase error signal 292 is proportional to the product of the signal slope at the sampling instant and the error between the sampled value and the ideal value. The ideal value is the value corresponding to the perfectly equalized and perfectly sampled signal (at the symbol rate) without any noise or other imperfections. Phase error signal 292 is used by digital phase lock loop circuit 270 to adjust the phase and frequency at which input signal 202 is sampled in an effort to achieve a sequence of ideal values. In some cases, the combination of slope and error calculation circuit 250 and phase detector circuit 260 are referred to as an "error calculation circuit".

Digital phase lock loop circuit 270 is a decision directed loop that is operated based on input data stream and/or earlier decisions made in relation to the data stream to avoid latency in obtaining updated sample times. After applying proper gains to phase error signal 292, digital phase lock look circuit 270 filters phase error signal using phase and frequency integrators. Ultimately, the output of digital phase lock loop circuit 270 is applied to a phase mixer circuit 240, and the output of phase mixer circuit 240 provides a digital control input to analog voltage controlled oscillator 235. Thus, the output of digital phase lock loop circuit 270 is operable to adjust the sampling instant of input data 202.

In particular, digital phase lock loop circuit 270 multiplies phase error signal 292 by a frequency gain 274 using a multiplier 272, and multiplies phase error signal 292 by a phase gain 284 using a multiplier 282. The output of multiplier 272 is aggregated with a value maintained in a frequency offset register 278 using a summation circuit 276, and the aggregated value from summation circuit 276 is stored back to frequency offset register 278. In some cases, the combination of frequency offset register 278 and summation circuit 276 are referred to as a frequency summation circuit. The value maintained in frequency offset register 278 is summed with the output of multiplier 282 using a summation circuit 286. The output of summation circuit 286 is aggregated with a value maintained in a phase offset register 290 using a summation circuit 288, and the aggregated value from summation circuit 288 is stored back to phase offset register 290. The value maintained in phase offset register 290 represents a combination of a desired frequency adjustment and phase adjustment needed to properly sample input 202. In some cases, the combination of phase offset register 290 and summation circuit 288 are referred to as a phase summation circuit, or a combination summation circuit as is combines both phase and frequency information. For the same reason, phase offset register 290 may be referred to as a combination offset register. The value maintained in phase offset register 290 is provided to phase mixer 240, and provides the basis for the digital control provided to analog voltage controlled oscillator 235.

During some periods, digital phase lock loop circuit 270 is unable to track the symbol rate of input data 202 and to provide an accurate estimate of the sampling clock. This condition is generally referred to as a loss of lock condition, and often occurs in bursts when digital phase lock loop circuit 270 is not tracking input 202 consistently. Loss of lock performance strongly depends on the quality of the estimated ideal values. Better loss of lock decisions may be achieve through use of more accurate later decisions (with latency) available from detector 245, rather than from the use of less accurate earlier decisions (without latency) to estimate the ideal sample values.

It has been found that loss of lock performance may be undermined where digital phase lock loop circuit 270 attempts to track an incoming signal where, for example, a large noise event is ongoing. In such a case, the noise event may result in a large value for phase error signal 292 that digital phase lock loop circuit 270 attempts to correct. This causes digital phase lock loop circuit 270 to adjust substantially away from the actual signal. This adjustment can result in an equally large error correction coming back the other way once the noise event has passed. In any event, this process of overcorrection not only results in a loss of lock condition, but also increases the duration of the loss of lock condition.

At least in part to address a potential recovery from a loss of lock condition, some embodiments of the present invention utilize a frequency limit circuit 280. Frequency limit circuit 280 limits the amount of frequency offset that may be incurred at any given time by digital phase lock loop circuit 270. When timing recovery circuit 200 is tracking input 202, most sampling points will be very near to an ideal sampling time. However, when a loss of lock condition is about to occur, sampling will drift from the ideal sampling time resulting in a change in the value maintained in frequency offset register 278. This change may either be an increase or decrease in the value maintained in frequency offset register 278 depending upon the change in phase error signal 292. Frequency limit circuit 280 operates to identify any substantial change in the value maintained in frequency offset register 278, and to artificially cap or temper any change. In this way, the value maintained in frequency offset register 278 remains somewhat close to the value maintained when digital phase lock loop circuit 270 was properly tracking input signal 202. Thus, even though a loss of lock condition may still occur where a significant noise event occurs, recovery from the loss of lock event may occur more quickly as the drift in the value of frequency offset register 278 is not as far from an ideal value as it would have otherwise been without the use of frequency limit circuit 280.

Where, for example, timing recovery circuit 200 is implemented as part of a hard disk drive system, a frequency error from one sector to another sector is typically known. Thus, a maximum and/or minimum value maintained in frequency offset register 278 can be estimated. In such a case, frequency limit circuit 280 may be implemented such that it does not allow the value in frequency offset register 278 to exceed a defined set of predicted values. Based on the disclosure provided herein, one of ordinary skill in the art will recognize a variety of approaches and/or circuitry that may be used in relation to embodiments of the present invention to limit the value maintained in frequency offset register 278. By limiting any change to frequency offset register 278 to a certain range, digital phase lock loop 270 will tend to stay in lock better, and where a loss of lock condition occurs it will tend to recover more quickly. As used herein, the value maintained in either or both of frequency offset register 278 and the output of phase offset register 290 may be referred to as an "adjustment value". Also, as used herein, frequency limit circuit 280 may be referred to generically as an adjustment limit circuit. It should be noted that the phrase "adjustment limit circuit" may include a number of different types of limit circuits in addition to a frequency limit circuit. For example, it may be used to refer to a phase limit circuit.

In other cases where a predefined estimate of the maximum and/or minimum values that may be utilized in frequency offset register 278 is not possible, digital phase lock loop 270 may be operated without the impact of frequency limit circuit 280 until a lock condition is achieved for a defined amount of time. Once the lock condition has been successfully maintained, the value maintained in frequency offset register 278, and used to achieve the lock condition becomes a baseline from which frequency limit circuit 280 operates. For example, frequency limit circuit 280 may be designed to allow a deviation of less than +/−10% from the baseline value, but won't allow adjustment of greater than the aforementioned percentage. Based on the disclosure provided herein, one of ordinary skill in the art will recognize a variety of circuits and/or approaches that may be used in accordance with different embodiments of the present invention to implement the aforementioned band limit. Further, based on the disclosure provided herein, one of ordinary skill in the art will recognize a variety of other limits and circuits for implementing such limits that may be applied to a baseline value in accordance with embodiments of the present invention. Again, by limiting any change to frequency offset register 278 to a certain range, digital phase lock loop 270 will tend to stay in lock better, and where a loss of lock condition occurs it will tend to recover more quickly.

Figure 3A:
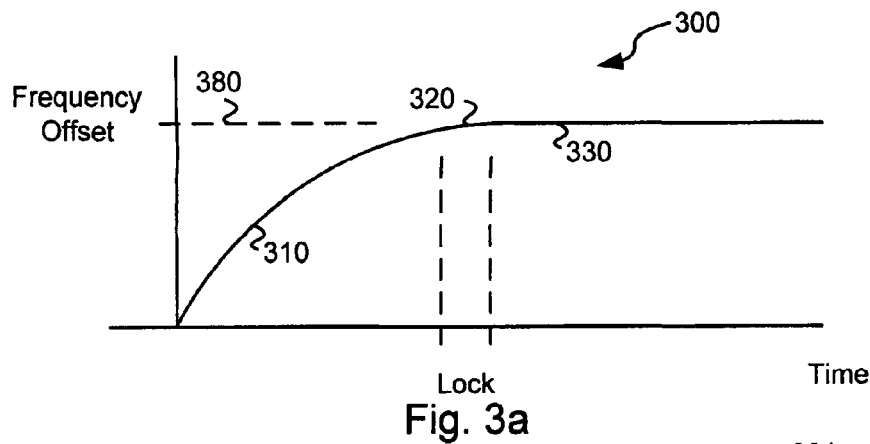
FIGS. 3a-3c are timing diagrams depicting the operation of the timing recovery circuit of FIG. 2 where frequency limits are alternatively included and not included.

Turning to FIG. 3a, operation of timing recovery circuit 200 is depicted as a timing diagram 300. In particular, timing diagram 300 shows the value maintained in frequency offset register 278 as digital phase lock loop circuit 270 moves from an unlocked condition represented by a segment 310 through a transitional phase represented by a segment 320 over which time a lock is established. During the unlocked period represented by segment 310, the timing recovered by timing recovery circuit 200 is inaccurate resulting in the sampling of input signal 202 at less than ideal times. Over time, the magnitude of phase error signal 292 decreases as the sampling period approaches a more ideal time. As phase error signal 292 decreases, the rate of change in segment 310 and segment 320 begins to decrease. Ultimately, the value maintained in frequency offset register 278 becomes stable as the sampling period governed by timing recovery circuit 200 more closely reflects ideal sample times. This condition is a lock condition represented by a segment 330. In this locked condition, the timing recovered by timing recovery circuit 200 is sufficiently accurate to cause sampling of input signal 202 to occur at approximately ideal times. This lock condition with a substantially constant value 380 in frequency offset register 278 is maintained until an intervening event such as noise occurs.

Figure 3B:
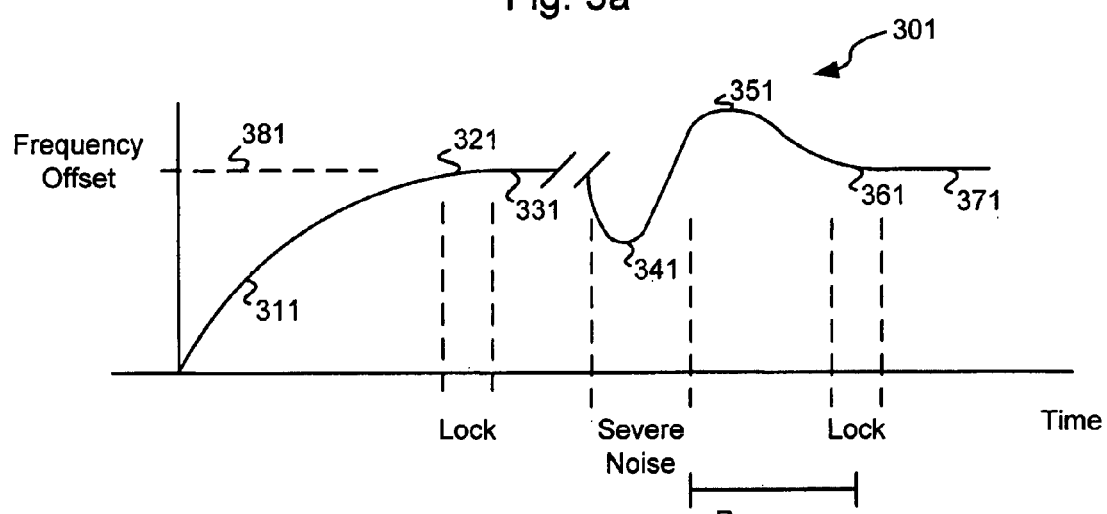

Turning to FIG. 3b, operation of timing recovery circuit 200 where an intervening noise event occurs is depicted as a timing diagram 301. In particular, timing diagram 301 shows the value maintained in frequency offset register 278 as digital phase lock loop circuit 270 moves from an unlocked condition represented by a segment 311 through a transitional phase represented by a segment 321 over which time a lock is established. During the unlocked period represented by segment 311, the timing recovered by timing recovery circuit 200 is inaccurate resulting in the sampling of input signal 202 at less than ideal times. Over time, the magnitude of phase error signal 292 decreases as the sampling period approaches a more ideal time. As phase error signal 292 decreases, the change in segment 311 and segment 321 begins to flatten out. Ultimately, the value maintained in frequency offset register 278 becomes stable as the sampling period governed by timing recovery circuit 200 more closely reflects ideal sample times. This condition is a lock condition represented by a segment 331. In this locked condition, the timing recovered by timing recovery circuit 200 is sufficiently accurate to cause sampling of input signal 202 to occur at approximately ideal times. This lock condition with a substantially constant value 381 in frequency offset register 278 is maintained until an intervening event such as noise occurs.

Timing diagram 301 includes a segment 341 representing the change in the value maintained in frequency offset register 278 as digital phase lock loop circuit 270 attempts to compensate for an error caused by a severe noise event. As shown, during segment 341, phase error signal 292 changes dramatically due to the introduced noise and the value in frequency offset register 278 changes quickly in an effort to compensate for the error indicated by phase error signal 292. The value may increase and/or decrease rather dramatically. At some point, the noise event resolves as represented by a segment 351, and the value maintained in frequency offset register 278 begins to adjust to compensate for a now accurate error represented by phase error signal 292. Ultimately, the value maintained in frequency offset register 278 adjusts during a segment 361 to achieve the lock condition and adjusts approximately to constant offset value 381 represented by a segment 371. A recovery time 391 represents a period of time from which a loss of lock condition occurs until a lock condition is reestablished.

Figure 3C:
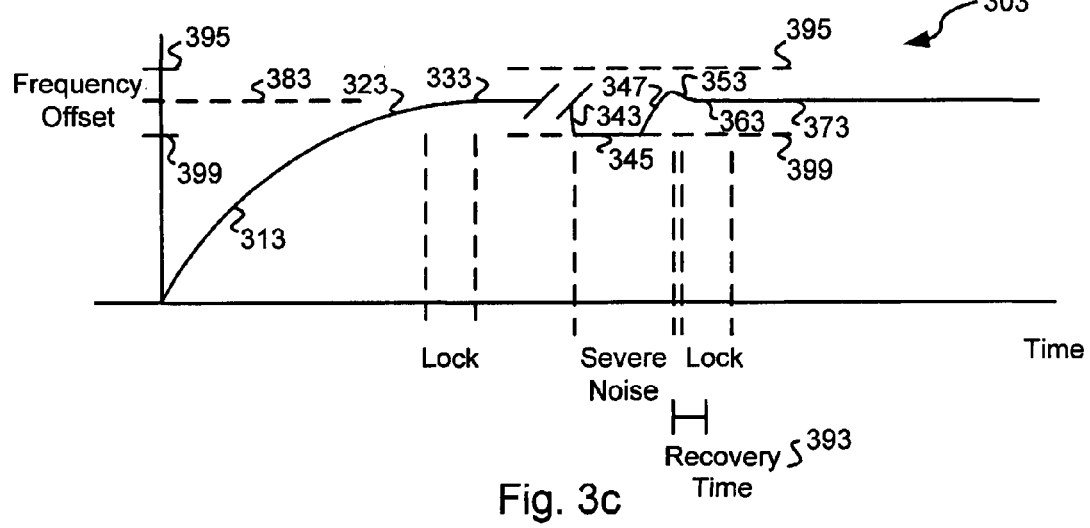

Turning to FIG. 3c, operation of timing recovery circuit 200 where an intervening noise event occurs is depicted as a timing diagram 303. As shown, timing diagram 303 shows the operation of timing recovery circuit 200 where frequency limit circuit 280 is used to limit any effect of an intervening noise event on digital phase lock loop circuit 270. In particular, timing diagram 303 shows the value maintained in frequency offset register 278 as digital phase lock loop circuit 270 moves from an unlocked condition represented by a segment 313 through a transitional phase represented by a segment 323 over which time a lock is established. During the unlocked period represented by segment 313, the timing recovered by timing recovery circuit 200 is inaccurate resulting in the sampling of input signal 202 at less than ideal times. Over time, the magnitude of phase error signal 292 decreases as the sampling period approaches a more ideal time. As phase error signal 292 decreases, the rate of change in segment 313 and segment 323 begins to decrease. Ultimately, the value maintained in frequency offset register 278 becomes stable as the sampling period governed by timing recovery circuit 200 more closely reflects ideal sample times. This condition is a lock condition represented by a segment 333. In this locked condition, the timing recovered by timing recovery circuit 200 is sufficiently accurate to cause sampling of input signal 202 to occur at approximately ideal times. This lock condition with a substantially constant value 383 in frequency offset register 278 is maintained until an intervening event such as noise occurs.

With constant value 383 established, a band represented by an upper limit 395 and a lower limit 399 may be established for the value that may be maintained in frequency offset register 278. Thus, when the same noise event occurs as was discussed in relation to timing diagram 301, a shorter recovery period from a loss of lock condition may be achieved. In particular, when the noise event occurs a change in phase error signal 292 is received by digital phase lock loop 270. This period is represented by a segment 343 where the value in frequency offset register 278 is modified to compensate for the change in phase error signal 292. Once the value in frequency offset register 278 hits lower limit 399 (or upper limit 395), it is not allowed to change any more. This period is represented by a segment 345. Once the magnitude of phase error signal 292 begins to correct due to the end of the noise event such that the value required to track phase error signal exceeds lower limit 399, the value in frequency offset register 278 begins to increase and decrease. This is represented by a segment 347 and a segment 353. As the deviation from constant value 383 is limited, a recovery time 393 required to overcome the loss of lock condition is reduced when compared with the unconstrained example of timing diagram 301. Ultimately, the value maintained in frequency offset register 278 adjusts during a segment 363 to achieve the lock condition and adjusts to approximately constant offset value 383 represented by a segment 373.

Figure 4:
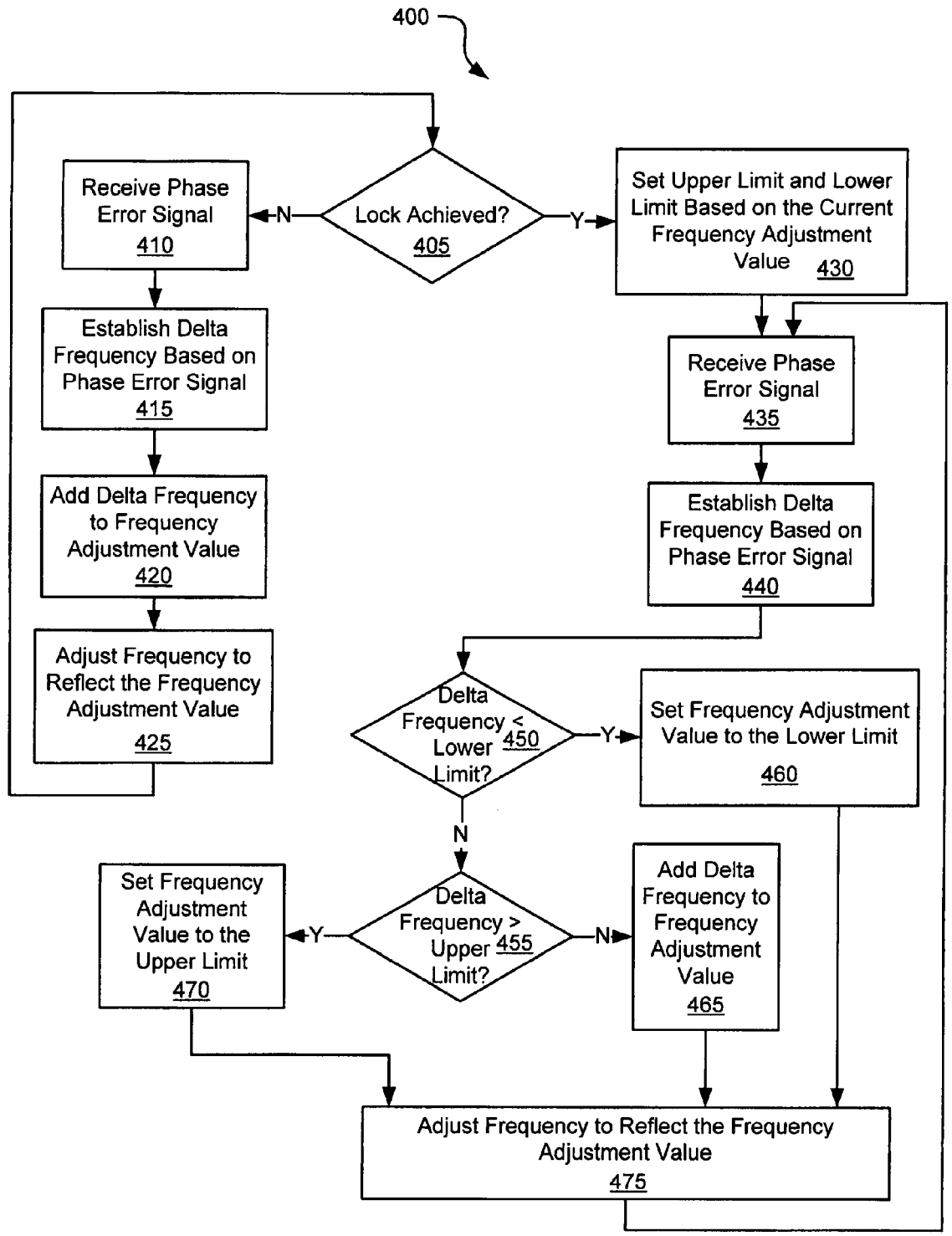
FIG. 4 is a flow diagram showing a method in accordance with some embodiments of the present invention for improved timing recovery.

Turning to FIG. 4, a flow diagram 400 depicts a method in accordance with various embodiments of the present invention for improved timing recovery. Following flow diagram 400, it is determined whether a lock condition has been achieved (block 405). Where a lock condition has not been achieved (block 405), the digital phase lock loop circuit is operated in an unrestrained condition. In particular, a phase error signal is received (block 410) and is converted into a delta frequency (block 415). The delta frequency is added to a frequency adjustment value (block 420), and a sampling frequency is adjusted to reflect the modified frequency adjustment value (block 425). It is then determined anew whether a lock condition has been achieved (block 405).

Where a lock condition has been achieved (block 405), an upper and a lower frequency adjustment value is set based on the current frequency adjustment value that resulted in the lock condition (block 430). This establishes the limited range in which the frequency adjustment value is allowed to change during subsequent operation. A phase error signal is received (block 435) and is converted into a delta frequency (block 440). Next, it is determined if addition of the delta frequency to the frequency adjustment value would cause the frequency adjustment value to exceed the lower limit (block 450) or the upper limit (block 455). Where the delta frequency causes the frequency adjustment to exceed the lower limit (block 450), the frequency adjustment value is set to the lower limit (block 460). Alternatively, where the delta frequency causes the frequency adjustment to exceed the upper limit (block 455), the frequency adjustment value is set to the upper limit (block 470). Otherwise, where the delta frequency causes the frequency adjustment to a value between the upper limit and the lower limit (blocks 450, 455), the delta frequency is added to the frequency adjustment value (block 465). The created frequency adjustment value is then used to adjust the sampling frequency (block 475).

Figure 5:
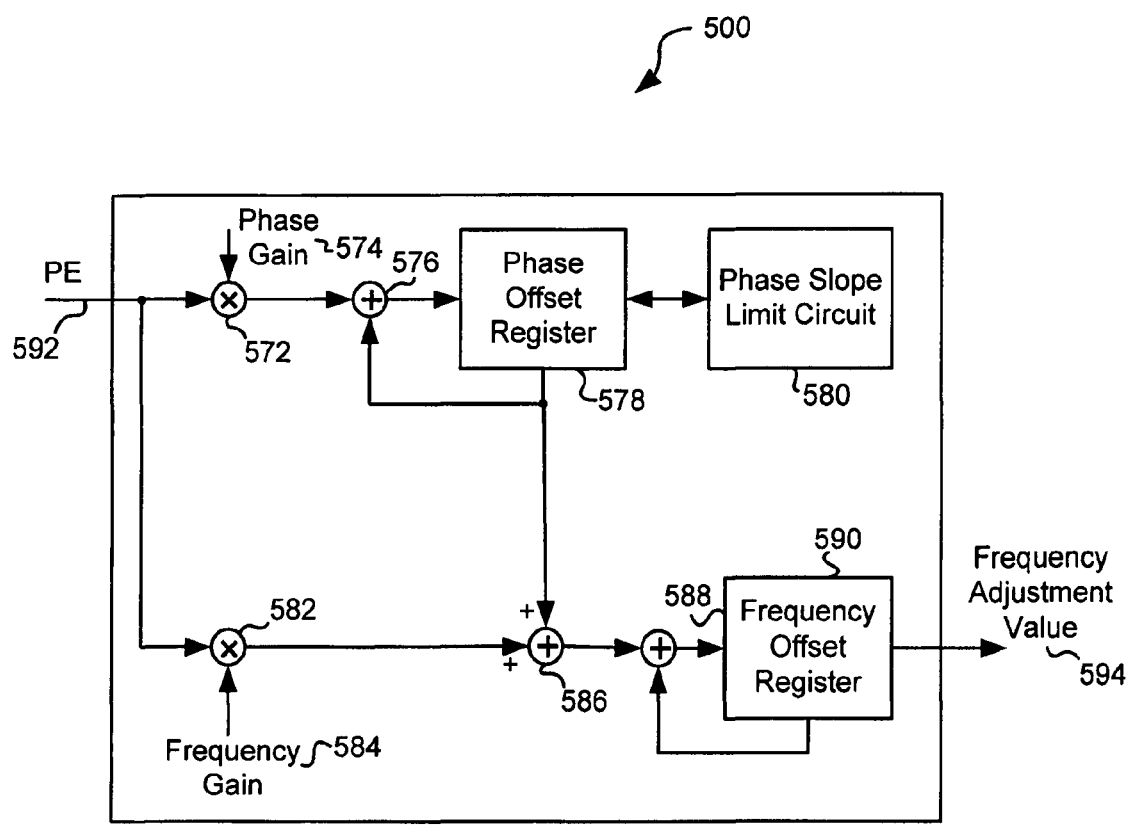
FIG. 5 shows an alternative digital phase lock loop circuit including adjustment limits in accordance with various embodiments of the present invention.

It should be noted that limited phase/frequency locking may be accomplished in accordance with some embodiments of the present invention by using circuits other than that depicted in FIG. 2. For example, digital phase lock loop 270 may be replaced by a digital phase lock loop 500 of FIG. 5 where phase change is limited through use of a phase slope limit circuit 580 that operates similar to frequency limit circuit 280 except that it operates to limit any change in the slope of the phase. In particular, phase slope limit circuit 580 operates to limit the rate of change of the value in phase offset register 578 both in the positive direction and the negative direction. Alternatively, a combination limit circuit (not shown) may be used to limit the change in the value maintained in phase offset register 290 of digital phase lock loop circuit 270, or to a frequency offset register 590 of digital phase lock loop 500. Turning to FIG. 5, similar to digital phase lock loop 270, digital phase lock loop 500 multiplies a phase error signal 592 by a phase gain 574 using a multiplier 572, and multiplies phase error signal 592 by a frequency gain 584 using a multiplier 282. The output of multiplier 572 is aggregated with a value maintained in a phase offset register 578 using a summation circuit 576, and the aggregated value from summation circuit 576 is stored back to phase offset register 578. The value maintained in phase offset register 578 is summed with the output of multiplier 582 using a summation circuit 586. The output of summation circuit 586 is aggregated with a value maintained in frequency offset register 590 using a summation circuit 588, and the aggregated value from summation circuit 588 is stored back to frequency offset register 590. The value maintained in frequency offset register 590 represents a combination of a desired frequency adjustment and phase adjustment needed to properly sample an input. This value is provided as a frequency adjustment value 594 to control a voltage controlled oscillator (not shown).

It should be noted that timing recovery circuits in accordance with different embodiments of the present invention may be tailored for use in a variety of applications. For example, such timing recovery circuits may be tailored for use in hard disk drives, cellular telephones, radio receivers, asynchronous networking devices and/or the like.

In conclusion, the invention provides novel systems, devices, methods and arrangements for improving data synchronization. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A timing recovery circuit, wherein the timing recovery circuit comprises:
   a digital phase lock loop circuit operable to:
      receive an error signal that indicates a difference between a predicted sample time and an ideal sample time, and
      apply an adjustment value such that a subsequent sample time is moved toward the ideal sample time;
   wherein the digital phase lock loop circuit includes:
      a phase gain circuit operable to modify the error signal by a phase gain to provide a phase gain output,
      a phase summation circuit, wherein the phase summation circuit maintains a phase offset value, and wherein the phase summation circuit includes:
         a phase offset register; and
         a first adder circuit, wherein the first adder circuit is operable to add a value maintained in the phase offset register to the phase gain output, and to write the product of the addition to the phase offset register subject to a limit imposed by an adjustment limit circuit;
      wherein the adjustment limit circuit is operable to detect a change in the phase offset value and to impose a limit on the phase offset value based at least in part on an offset value used to achieve a lock condition, and wherein the adjustment value is based at least in part on the phase offset value,
      a combination summation circuit, wherein the combination summation circuit maintains a combined adjustment value, and wherein the combination adjustment circuit includes:
         a combination offset register; and
         a second adder circuit, wherein the second adder circuit is operable to add a value maintained in the combination offset register to a frequency gain output and to the value maintained in the phase offset register, and to write the product of the addition to the combination offset register.

2. The timing recovery circuit of claim 1, wherein the timing recovery circuit further comprises:
   a detector, wherein the detector is operable to receive a data set, wherein the received data set represents an original data set corrupted by noise, and wherein the detector is further operable to provide an estimation of the original data set based at least in part on the received data set; and
   an error calculation circuit, wherein the error calculation circuit provides the error signal, and wherein a component of the error signal includes a difference between the received data set and the estimation of the original data set.

3. The timing recovery circuit of claim 2, wherein the error calculation circuit includes:
   a slope and error calculation circuit, wherein the slope and error calculation circuit provides a slope output and the difference between the received data set and the estimation of the original data set; and
   a multiplier circuit, wherein the multiplier circuit combines the slope output and the difference between the received data set and the estimation of the original data set to create the error signal.

4. The timing recovery circuit of claim 2, wherein the detector is selected from a group consisting of: an LDPC detector and a Viterbi detector.

5. The timing recovery circuit of claim 1, wherein the adjustment limit circuit limits the magnitude of the frequency offset value maintained in the frequency offset register.

6. The timing recovery circuit of claim 1, wherein the adjustment limit circuit is operable to receive an upper limit and a lower limit.

7. The timing recovery circuit of claim 1, wherein the adjustment limit circuit is operable to receive a baseline value, and to establish an upper limit and a lower limit based at least in part on the baseline value.

8. The timing recovery circuit of claim 1, wherein the timing recovery circuit is implemented in a device selected from a group consisting of: a storage device and communication device.

9. A storage device, wherein the storage device comprises:
   a storage medium, and
   a read channel, wherein the read channel includes:
      a digital phase lock loop circuit operable to:
         receive an error signal that indicates a difference between a predicted sample time and an ideal sample time, and
         apply an adjustment value such that a subsequent sample time is moved toward the ideal sample time;
      wherein the digital phase lock loop circuit includes:
         a phase gain circuit operable to modify the error signal by a phase gain to provide a phase gain output,
         a phase summation circuit, wherein the phase summation circuit maintains a phase offset value, and wherein the phase summation circuit includes:
            a phase offset register; and
            a first adder circuit, wherein the first adder circuit is operable to add a value maintained in the phase offset register to the phase gain output, and to write the product of the addition to the phase offset register subject to a limit imposed by an adjustment limit circuit;
         wherein the adjustment limit circuit is operable to detect a change in the phase offset value and to impose a limit on the phase offset value based at least in part on an offset value used to achieve a lock condition, and wherein the adjustment value is based at least in part on the phase offset value,
         a combination summation circuit, wherein the combination summation circuit maintains a combined adjustment value, and wherein the combination adjustment circuit includes:
            a combination offset register; and
            a second adder circuit, wherein the second adder circuit is operable to add a value maintained in the combination offset register to a frequency gain output and to the value maintained in the phase offset register, and to write the product of the addition to the combination offset register.

10. The storage device of claim 9, wherein the adjustment limit circuit is operable to receive an upper limit and a lower limit.

11. The storage device of claim 9, wherein the adjustment limit circuit is operable to receive a baseline value, and to establish an upper limit and a lower limit based at least in part on the baseline value.

12. The storage device of claim 9, wherein the read channel further includes:
 a detector operable to receive a data set, wherein the received data set represents an original data set corrupted by noise, and wherein the detector is further operable to provide an estimation of the original data set based at least in part on the received data set; and
 an error calculation circuit operable to provide the error signal, and wherein a component of the error signal includes a difference between the received data set and the estimation of the original data set.

13. The storage device of claim 12, wherein the error calculation circuit includes:
 a slope and error calculation circuit operable to provide a slope output and the difference between the received data set and the estimation of the original data set; and
 a multiplier circuit operable to combine the slope output and the difference between the received data set and the estimation of the original data set to create the error signal.

14. The storage device of claim 9, wherein the adjustment limit circuit limits the magnitude of the phase offset value maintained in the phase offset register.

15. A communication device, wherein the communication device comprises:
 a receiver, wherein the receiver is operable to receive an information set; and
 a decoder, wherein the decoder is operable to decode the information set, and wherein the decoder includes:
  a digital phase lock loop circuit operable to:
   receive an error signal that indicates a difference between a predicted sample time and an ideal sample time, and
   apply an adjustment value such that a subsequent sample time is moved toward the ideal sample time;
  wherein the digital phase lock loop circuit includes:
   a phase gain circuit operable to modify the error signal by a phase gain to provide a phase gain output,
   a phase summation circuit, wherein the phase summation circuit maintains a phase offset value, and wherein the phase summation circuit includes:
    a phase offset register; and
    a first adder circuit, wherein the first adder circuit is operable to add a value maintained in the phase offset register to the phase gain output, and to write the product of the addition to the phase offset register subject to a limit imposed by an adjustment limit circuit;
   wherein the adjustment limit circuit is operable to detect a change in the phase offset value and to impose a limit on the phase offset value based at least in part on an offset value used to achieve a lock condition, and wherein the adjustment value is based at least in part on the phase offset value,
   a combination summation circuit, wherein the combination summation circuit maintains a combined adjustment value, and wherein the combination adjustment circuit includes:
    a combination offset register; and
    a second adder circuit, wherein the second adder circuit is operable to add a value maintained in the combination offset register to a frequency gain output and to the value maintained in the phase offset register, and to write the product of the addition to the combination offset register.

16. The communication device of claim 15, wherein the adjustment limit circuit is operable to receive an upper limit and a lower limit.

17. The communication device of claim 15, wherein the adjustment limit circuit is operable to receive a baseline value, and to establish an upper limit and a lower limit based at least in part on the baseline value.

18. The communication device of claim 15, wherein the decoder further includes:
 a detector operable to receive a data set, wherein the received data set represents an original data set corrupted by noise, and wherein the detector is further operable to provide an estimation of the original data set based at least in part on the received data set; and
 an error calculation circuit operable to provide the error signal, and wherein a component of the error signal includes a difference between the received data set and the estimation of the original data set.

19. The communication device of claim 18, wherein the error calculation circuit includes:
 a slope and error calculation circuit operable to provide a slope output and the difference between the received data set and the estimation of the original data set; and
 a multiplier circuit operable to combine the slope output and the difference between the received data set and the estimation of the original data set to create the error signal.

20. The communication device of claim 15, wherein the adjustment limit circuit limits the magnitude of the phase offset value maintained in the phase offset register.

* * * * *